(12) United States Patent
Okumura et al.

(10) Patent No.: US 9,252,390 B2
(45) Date of Patent: Feb. 2, 2016

(54) PRODUCTION METHOD FOR JOINED BODY, AND JOINED BODY

(71) Applicant: JOLED INC., Tokyo (JP)

(72) Inventors: Hiroko Okumura, Osaka (JP); Hiroyuki Masuda, Hyogo (JP)

(73) Assignee: JOLED INC., Tokyo (JP)

(*) Notice: Subject to any disclaimer, the term of this patent is extended or adjusted under 35 U.S.C. 154(b) by 0 days.

(21) Appl. No.: 14/388,876

(22) PCT Filed: Aug. 6, 2013

(86) PCT No.: PCT/JP2013/004753
§ 371 (c)(1),
(2) Date: Sep. 29, 2014

(87) PCT Pub. No.: WO2014/024478
PCT Pub. Date: Feb. 13, 2014

(65) Prior Publication Data
US 2015/0053952 A1 Feb. 26, 2015

(30) Foreign Application Priority Data
Aug. 7, 2012 (JP) .................... 2012-175337

(51) Int. Cl.
*H01L 21/30* (2006.01)
*H01L 27/32* (2006.01)
(Continued)

(52) U.S. Cl.
CPC .............. *H01L 51/5246* (2013.01); *B32B 7/12* (2013.01); *B32B 38/0008* (2013.01);
(Continued)

(58) Field of Classification Search
CPC .............. H01L 27/322; H01L 27/3251; H01L 51/0024; H01L 51/5246; H01L 51/56

USPC .......................................................... 438/458
See application file for complete search history.

(56) References Cited

U.S. PATENT DOCUMENTS 4,249,438 A * 2/1981 Kelley ................... B26D 3/085
83/167
4,548,113 A * 10/1985 Topperwien ......... B26D 7/2614
83/345

(Continued)

FOREIGN PATENT DOCUMENTS

JP      2002-322440      11/2002
JP      2007-200591      8/2007

(Continued)

OTHER PUBLICATIONS

U.S. Appl. No. 14/388,874 to Hiroko Okumura et al., filed Sep. 29, 2014.

(Continued)

*Primary Examiner* — Earl Taylor
(74) *Attorney, Agent, or Firm* — Greenblum & Bernstein, P.L.C.

(57) ABSTRACT

A method for manufacturing a joined body composed of a first substrate and a second substrate joined together by sealing resin material attached to a predetermined area of the first substrate includes: attaching a sheet material to the first substrate so as to cover the predetermined area, the sheet material including a sheet base material and the resin material provided on one main surface of the sheet base material; forming, after the attaching, in the sheet material, a slit by reducing a thickness of the resin material along an outline of the predetermined area; and separating, after the forming, part of the resin material inside the slit from the sheet base material to keep the part of the resin material inside the slit on the predetermined area of the first substrate and not to keep the rest of the resin material outside the slit on the first substrate.

12 Claims, 15 Drawing Sheets

(51) Int. Cl.
*H01L 51/52* (2006.01)
*B32B 7/12* (2006.01)
*C09J 5/00* (2006.01)
*C09J 7/00* (2006.01)
*B32B 38/00* (2006.01)
*B32B 38/10* (2006.01)
*H01L 51/56* (2006.01)

(52) U.S. Cl.
CPC .............. *B32B 38/10* (2013.01); *B32B 38/105* (2013.01); *C09J 5/00* (2013.01); *C09J 7/00* (2013.01); *H01L 27/322* (2013.01); *H01L 51/5253* (2013.01); *H01L 51/56* (2013.01); *B32B 2457/12* (2013.01)

(56) References Cited

U.S. PATENT DOCUMENTS

| | | | | | |
|---|---|---|---|---|---|
| 4,578,004 | A | * | 3/1986 | Reil | B26D 3/085 408/101 |
| 4,662,969 | A | * | 5/1987 | Wang | B26F 1/31 156/253 |
| 4,696,394 | A | * | 9/1987 | Estkowski | B60B 33/0028 206/303 |
| 4,790,475 | A | * | 12/1988 | Griffin | B41J 13/24 206/820 |
| 6,739,040 | B1 | * | 5/2004 | Nakamura | H05K 3/4069 174/255 |
| 9,156,206 | B2 | * | 10/2015 | Masuda | G02B 5/201 |
| 2004/0239827 | A1 | * | 12/2004 | Yamazaki | H01L 27/1214 349/45 |
| 2007/0090759 | A1 | * | 4/2007 | Choi | H01L 51/524 313/512 |
| 2009/0004772 | A1 | * | 1/2009 | Jinbo | H01L 29/66969 438/99 |
| 2009/0134786 | A1 | * | 5/2009 | Matsuzaki | H01L 51/5237 313/504 |
| 2010/0044078 | A1 | * | 2/2010 | Narahashi | B32B 37/025 174/250 |
| 2012/0064236 | A1 | * | 3/2012 | Matsuzaki | H05K 1/0366 427/171 |
| 2014/0127480 | A1 | * | 5/2014 | Masuda | G02B 5/201 428/201 |
| 2015/0053952 | A1 | * | 2/2015 | Okumura | B32B 7/12 257/40 |
| 2015/0054006 | A1 | * | 2/2015 | Okumura | H01L 51/56 257/89 |

FOREIGN PATENT DOCUMENTS

| | | |
|---|---|---|
| JP | 2010-182530 | 8/2010 |
| JP | 2011-201978 | 10/2011 |
| WO | 2008/142985 | 11/2008 |
| WO | 2012/164612 | 12/2012 |

OTHER PUBLICATIONS

International Search Report (ISR) in International Patent Application No. PCT/JP2013/004753, dated Oct. 29, 2013.

* cited by examiner

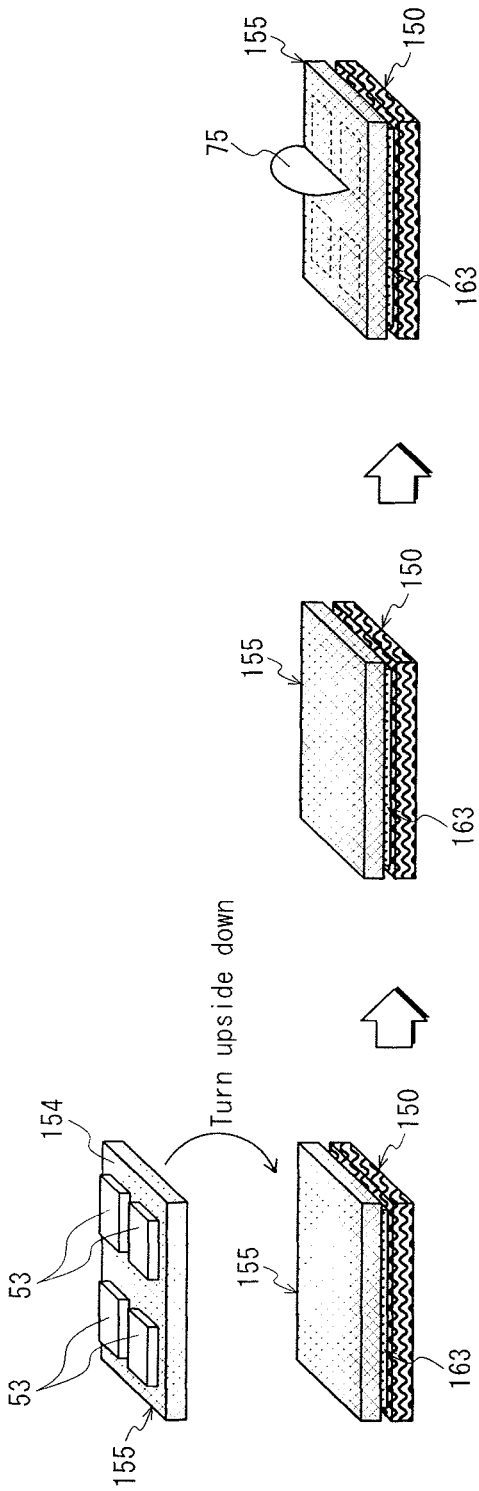

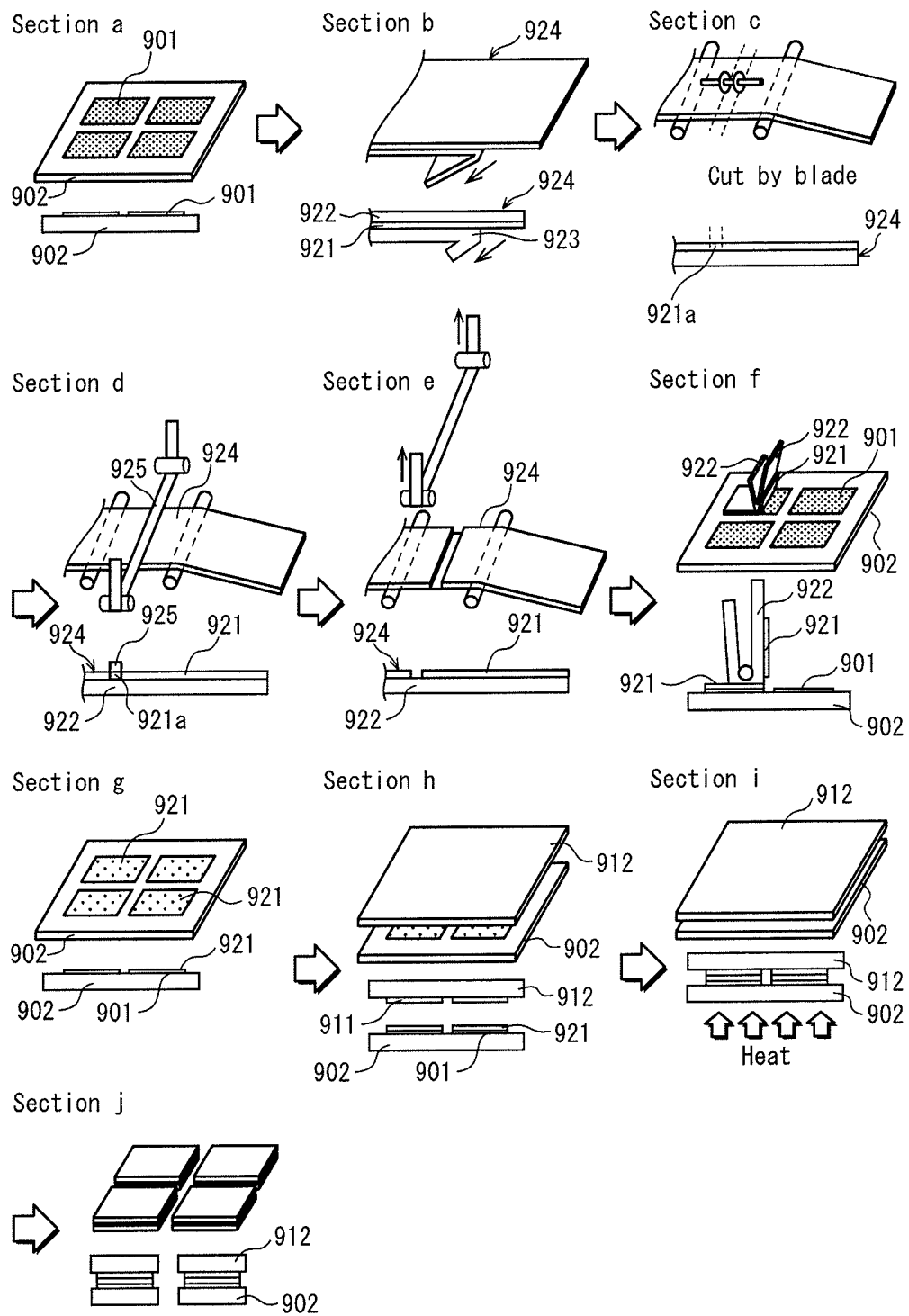

PRODUCTION METHOD FOR JOINED BODY, AND JOINED BODY

TECHNICAL FIELD

The present invention relates to a method for manufacturing a joined body composed of a first substrate and a second substrate joined together by resin material attached to a predetermined area of the first substrate, and the joined body.

BACKGROUND ART

There is a conventional joined body manufactured by joining a first substrate and a second substrate by using sheet-like resin material sandwiched between the first substrate and the second substrate. Such resin material is supplied as a sheet material, and the resin material is applied to the main surface of a sheet-like first separator (e.g., a film made of resin) and is covered with a second separator (e.g., a film made of resin), for example.

Such a joined body is manufactured through an attaching step of attaching resin material to the first substrate, a uniting step of uniting the first substrate and the second substrate, and a curing step of curing the resin material.

The following describes a technology of attaching a sheet-like resin material to the first base material, with reference to a figure (for example, Patent Literatures 1 and 2).

According to a conventional technology as shown in FIG. 15, a joined body is manufactured through the following steps.

(A) Preparing a first substrate 902 that includes a plurality of first functional units 901, and performing UV ozone cleaning (section a in FIG. 15).

(B) Preparing a (rolled) sheet material 924 composed of resin material 921 and two separators 922 and 923 sandwiching the resin material 921, and peeling off one of the separators (here, the lower separator 923) while drawing out the sheet material 924 (section b in FIG. 15).

(C) Forming a cut-slit that is completely cut in the surface of the resin material 921 from which the separator 923 has been removed along an outline of a resin material part 921a of the resin material 921 (not forming a cut-slit in the other separator 922) (section c in FIG. 15).

(D) Attaching a peeling tape 925 to a part inside the resin material part 921a (section d in FIG. 15).

(E) Removing unnecessary resin material (921a) by peeling the peeling tape 925 off (section e in FIG. 15).

(F and G) Attaching the resin material 921 remaining on the other separator 922 and cutting into a predetermined size to each of the first functional units 901 of the first substrate 902, and peeling off the other separator 922 (sections f and g in FIG. 15).

(H) Uniting a second substrate 912 that includes a plurality of second functional units to the first substrate 902 so that the first functional units 901 correspond one-to-one in position to the second functional units (section h in FIG. 15).

(I) Curing the resin material 921 by heating (or applying UV to) the united first substrate 902 and second substrate 912 (section i in FIG. 15).

(J) Dividing the joined first substrate 902 and second substrate 912 into individual joined bodies each composed of the first functional unit 901 and the second functional unit, after curing the resin material 921 (section j in FIG. 15).

CITATION LIST

Patent Literature

[Patent Literature 1]
Japanese Patent Application Publication No. 2007-200591

[Patent Literature 2]
Japanese Patent Application Publication No. 2010-182530

SUMMARY OF INVENTION

Technical Problem

However, the above conventional technology has a problem that it is difficult to accurately attach the resin material 921 to the first functional units 901 of the first substrate 902. This is due to when a layer of the resin material 921 is formed on each of the functional units 901, the resin material 921 is deformed during for example processing for attaching and cutting the resin material 921. As a result, a trouble has occurred in joining by the resin material 921 according to the above conventional technology.

The present invention has been achieved in view of the above problem, and an aim thereof is to provide a joined body manufacturing method with which joining by the resin material is appropriately performed.

Solution to Problem

In order to solve the above problem, one aspect of the present invention provides a method for manufacturing a joined body composed of a first substrate and a second substrate joined together by resin material attached to a predetermined area of the first substrate, the method comprising: attaching a sheet material to the first substrate so as to cover the predetermined area, the sheet material including a sheet base material and the resin material provided on one main surface of the sheet base material; forming, after the attaching, in the sheet material, a slit by reducing a thickness of the resin material along an outline of the predetermined area; and separating, after the forming, part of the resin material inside the slit from the sheet base material to keep the part of the resin material inside the slit on the predetermined area of the first substrate and not to keep the rest of the resin material outside the slit on the first substrate.

Advantageous Effects of Invention

According to an aspect of the present invention, the sheet material is cut along the outline of the predetermined area after the sheet material is attached to the first substrate, and it is therefore unnecessary to preliminarily cut the resin material along the outline of the predetermined area and attach the cut resin material to the first substrate. For this reason, the deformation of the resin material, which occurs when the cut resin material is attached to the first substrate, does not occur. Also, attaching accuracy of attaching the cut resin material to the first substrate is improved. Therefore, it is possible to more accurately attach the resin material to the first substrate than conventional technology.

BRIEF DESCRIPTION OF DRAWINGS

FIG. 13 illustrates the method of manufacturing the display panel of Embodiment 2.

FIG. 15 shows a conventional technology.

DESCRIPTION OF EMBODIMENTS

Outline of Embodiments

Figure 1:
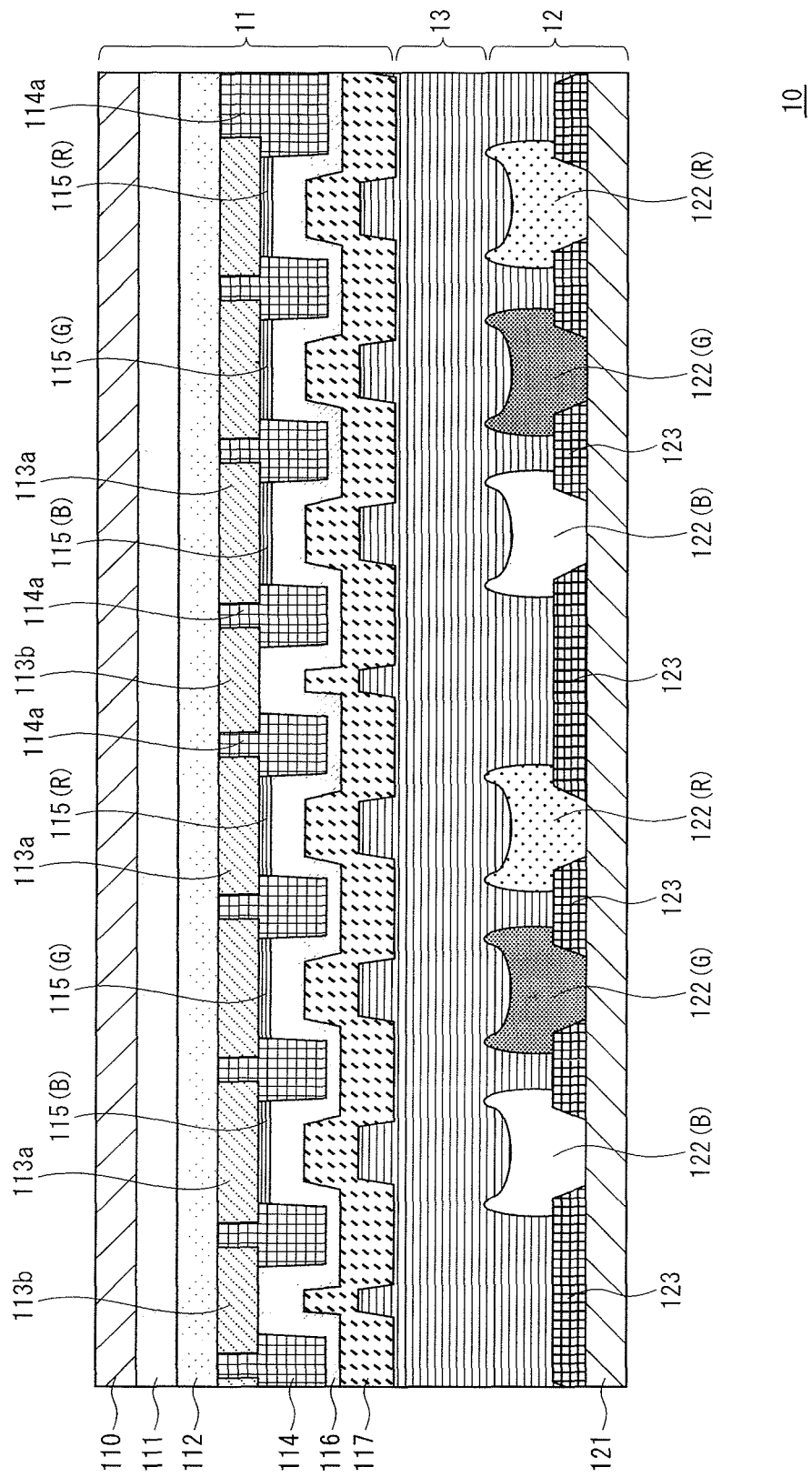
FIG. 1 is a partial cross-sectional view schematically showing primary components of a display panel of Embodiment 1.

An embodiment provides a method for manufacturing a joined body composed of a first substrate and a second substrate joined together by resin material attached to a predetermined area of the first substrate, the method comprising: attaching a sheet material to the first substrate so as to cover the predetermined area, the sheet material including a sheet base material and the resin material provided on one main surface of the sheet base material; forming, after the attaching, in the sheet material, a slit by reducing a thickness of the resin material along an outline of the predetermined area; and separating, after the forming, part of the resin material inside the slit from the sheet base material to keep the part of the resin material inside the slit on the predetermined area of the first substrate and not to keep the rest of the resin material outside the slit on the first substrate. With this structure, it is possible to appropriately perform joining by the resin material.

Also, in the forming, the slit is formed by irradiating the resin material with a laser beam to remove the resin material to the extent that the thickness of the irradiated resin material partially remains. With this structure, it is possible to easily perform the separating.

Also, owing to irradiation with the laser beam, at least part of the resin material that remains in a bottom part of the slit is higher in reaction rate than the resin material before irradiation with the laser beam. Alternatively, owing to irradiation with the laser beam, part of the resin material constituting a sidewall of the slit is higher in reaction rate than the resin material before irradiation with the laser beam. With these structures, it is possible to easily perform the separating.

Also, a wavelength of the laser beam is a wavelength at which the resin material and the sheet base material absorb the laser beam, and a power of the laser beam is a power that causes the resin material to disperse heat, evaporate, or sublime. With this structure, it is possible to easily form the slit. Alternatively, the laser beam has a light intensity distribution with a top hat shape. With this structure, it is possible to form the slit each so as to have a right-angled U-shape cross section.

Also, the sheet material has a layer structure of at least the sheet base material and the resin material. With this structure, it is possible to easily handle the resin material (exhibit a high handleability of the resin material before and during the attaching).

Also, the first substrate includes a first functional unit used for a display panel that is formed on a first base material, and the slit is formed in an area of the first functional unit in which no image is to be displayed. With this structure, it is possible to accurately provide the resin material in the first functional unit.

Also, the joined body is a display panel, the first substrate includes a first functional unit that is formed on a first base material, the second substrate includes a second functional unit that is formed on a second base material, the predetermined area of the first substrate is on a surface of the first substrate facing the second functional unit, in the attaching, the sheet material is attached while the resin material faces the first functional unit, and the method further comprises: uniting, after the separating, the first substrate and the second substrate while the first functional unit and the second functional unit correspond to each other; and curing, after the uniting, the resin material remaining on the predetermined area of the first substrate united with the second base material, wherein the forming is performed before the uniting. With this structure, it is possible to decrease the distance between the periphery of each of the functional units and the periphery of the display panel (the width of a frame of the display panel). In other words, it is possible to realize frame narrowing.

Also, the first functional unit formed on the first base material is provided in a plurality, and the second functional unit formed on the second base material is provided in a plurality. With this structure, it is possible to obtain a plurality of display panels from the joined body.

Also, the first functional unit is a color filter element, and the second functional unit is an EL element. With this structure, it is possible to obtain a narrow-frame display panel using the EL element.

Also, the method further comprises forming, before the attaching, a release film outside the predetermined area of the first substrate. With this structure, it is possible to easily remove the resin material outside the predetermined area.

An embodiment provides a joined body formed by joining a first substrate and a second substrate by resin material attached to a predetermined area of the first substrate, and by cutting the first substrate and the second substrate along the predetermined area in a direction of thickness of the first substrate and the second substrate, wherein the first substrate includes a first base material and a first functional unit formed on a surface of the first base material facing the second substrate, and an area surrounding the predetermined area is smaller in thickness of the resin material than the predetermined area. With this structure, it is possible to use the above manufacturing method.

Also, the surrounding area is higher in polymerization degree of the resin material than the predetermined area. With this structure, it is possible to use a laser beam for removing the resin material as the sheet material along the outline of the surrounding area.

Also, the second substrate includes a second base material and a second functional unit formed on a surface of the second base material facing the first substrate, the second functional unit having a plurality of light-emitting elements differing in color, and the first functional unit includes a plurality of color filters disposed in correspondence to the light-emitting elements. With this structure, it is possible to obtain a narrow-frame display panel.

[Process by which the Present Invention was Achieved]

Before description of embodiments the present invention, the following describes in detail the process by which the present invention was achieved and the technical problem to be solved by the present invention.

The above conventional technology has the problem that it is difficult to accurately attach the resin material to the first functional unit.

That is, the resin material is deformed when the sheet material is cut in accordance with a position of the first functional unit. Also, the resin material is deformed (mainly expanded) when the cut sheet material is attached to the first functional unit. Further, the resin material is deformed when the separator is peeled off. As a result, the size of the resin material attached to the first functional unit differs from the size of the resin material at the time of being cut.

In view of the above problem, one embodiment of the present invention provides a joined body manufacturing method with which the resin material is accurately attached to the first substrate.

One of candidates for the above manufacturing method is a method according to which, after a sheet-like resin material is attached to the entire surface of the first substrate, a cut-slit that is completely cut (laser cut portion) is formed on a border between a predetermined area and an unnecessary part that surrounds the predetermined area by irradiating the border with a laser beam, and the sheet-like resin material attached to the unnecessary part that surrounds the predetermined area is removed.

According to this candidate method, however, when the border between the predetermined area the unnecessary part is irradiated with the laser beam, the first substrate might be damaged by the laser beam. If the first substrate is damaged, cracks occur in the first substrate and as a result the first substrate. The present invention was made in view of the problem.

EMBODIMENTS

The following describes the joined body manufacturing method and the joined body pertaining to embodiments of the present invention with reference to the drawings. No particular limitation is intended regarding the materials and quantities thereof used in the present invention as described in the exemplary embodiment. The exemplary embodiment may be optionally modified, as appropriate, and combined with other embodiments, provided that the technical scope of the disclosure is not exceeded in doing so, and that no contradictions result.

Embodiment 1

In the present embodiment, a display panel is described as an example of a joined body.

In the field of display devices such as an EL display device and a liquid crystal display device, there is a demand for increase of an area occupied by a display unit (screen) with respect to the area of the display device viewed from the front (of the screen). That is, there is a demand for decrease of the distance between the periphery of the display unit and the periphery of the display device (the width of a frame of the display device), i.e., a demand for frame narrowing.

The display panel of the EL display device is formed by attaching a resin material supplied as a sheet material to a surface of an EL element on an EL substrate body or a surface of a CF element on a CF substrate body described below, uniting the EL substrate body to the CF substrate body, and joining the EL substrate body and the CF substrate body by using the resin material.

If the technology described in the background art section is used when manufacturing such a display panel, it is impossible to accurately attach the sheet material to the EL element or the CF element serving as the functional unit, and it is therefore impossible to meet the above demand for frame narrowing.

To be specific, in order to meet the demand for frame narrowing, attaching accuracy of the sheet material to the EL element or the CF element needs to be 100 order, while according to the technology described in the background art section, attaching accuracy thereof is 1 mm order.

The following describes an EL display panel (hereinafter, simply referred to as "display panel").

1. STRUCTURE (1) Overall Structure

FIG. 1 is a partial cross-sectional view schematically showing primary components of a display panel 10 of Embodiment 1.

As shown in FIG. 1, the display panel 10 includes an EL panel substrate 11 and a CF panel substrate 12, and a sealing resin layer 13 is interposed between the EL panel substrate 11 and the CF panel substrate 12.

The sealing resin layer 13 is formed by curing the above-described sealing resin material 63 supplied as the sheet material. The sealing resin layer 13 is provided in order to join the EL panel substrate 11 and the CF panel substrate 12, as well as to prevent the intrusion of water, gases, and other outside elements into the EL panel substrate 11.

Let the light output surface of the display panel 10 be the top or upper surface thereof, which corresponds to the bottom of the display panel 10 in FIG. 1.

(2) EL Panel Substrate

The EL panel substrate 11 includes an EL substrate body and an EL element. In other words, the EL panel substrate 11 is made up of the EL substrate body, an inter-layer insulating film, anodes, banks, light-emitting layers, and so on.

Figure 2:
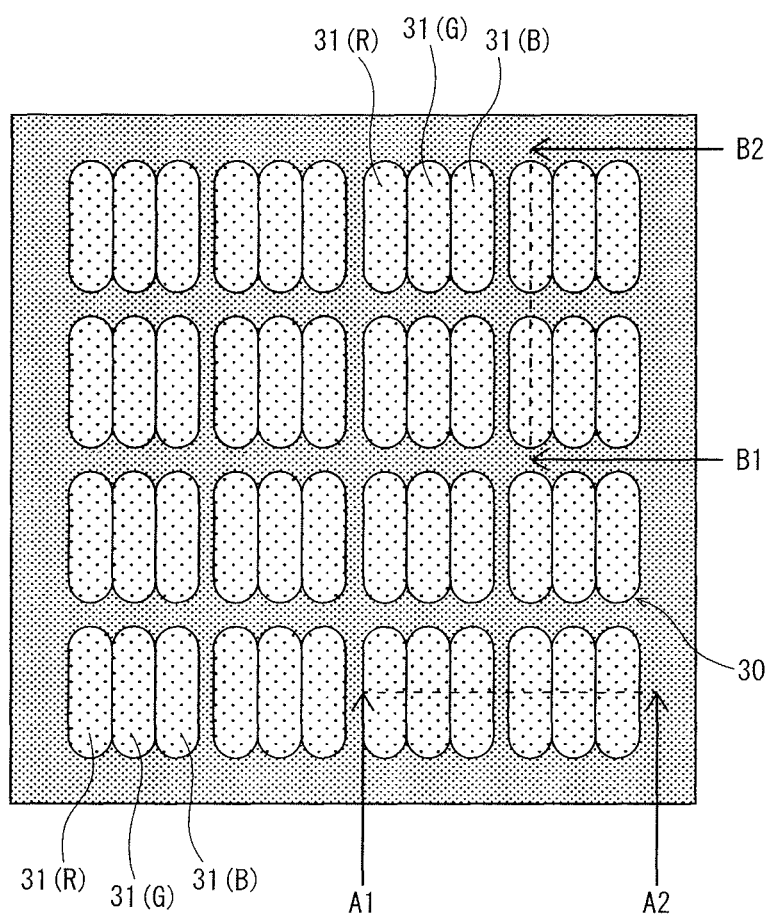
FIG. 2 is a plan view of an EL element.
Figure 3:
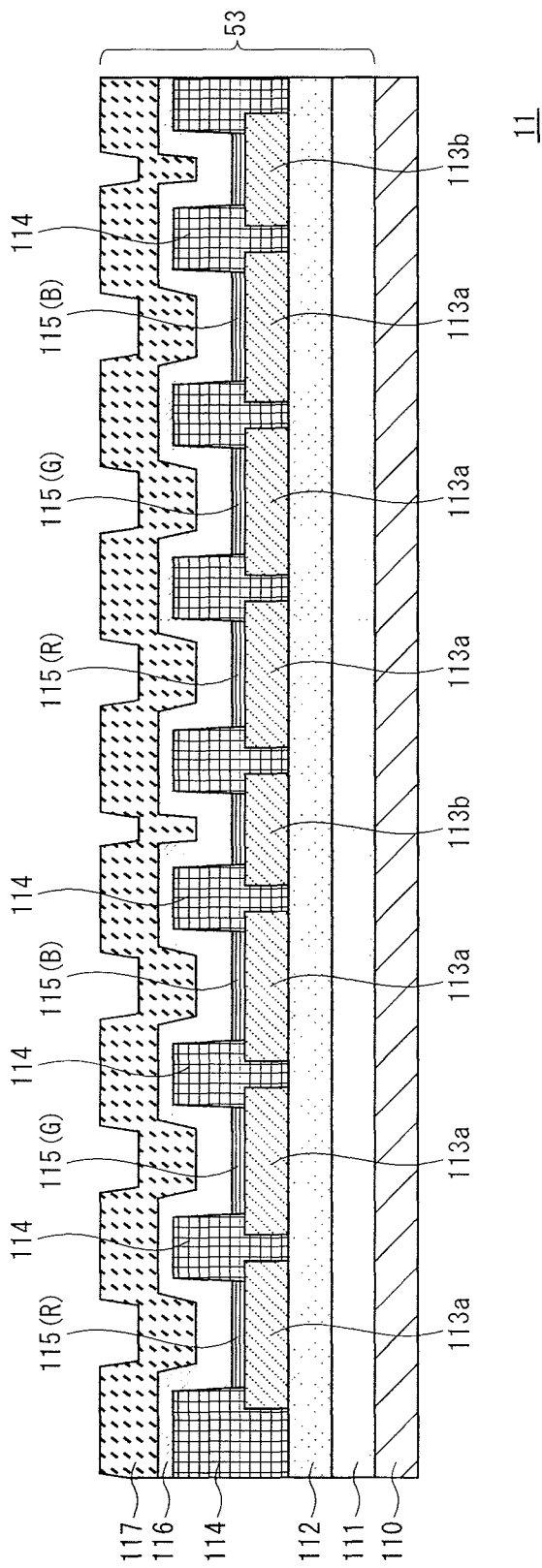
FIG. 3 is a cross-sectional view taken along line A1-A2 in a direction indicated by an arrow in FIG. 2.
Figure 4:
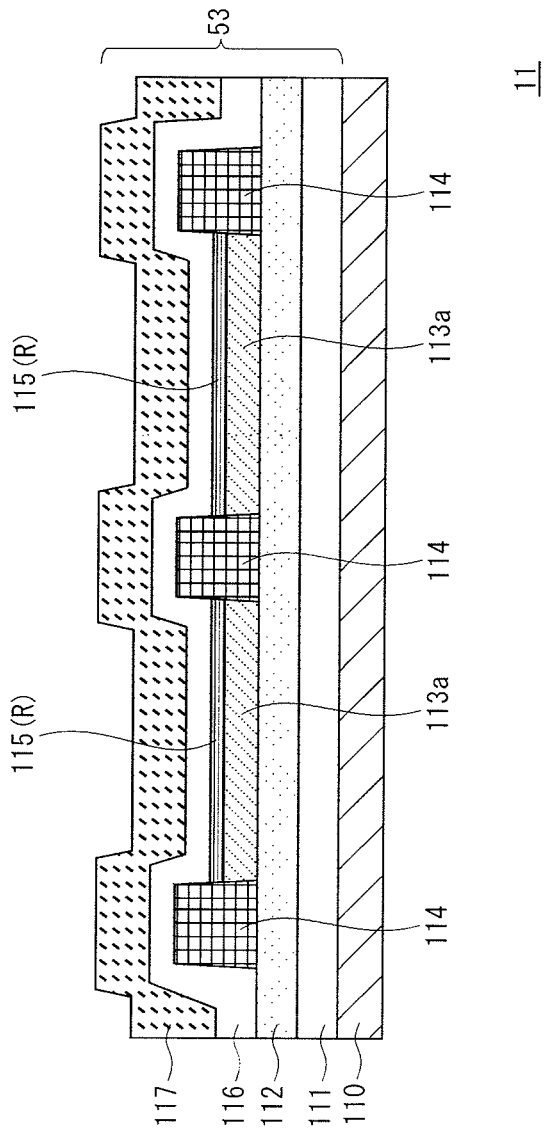
FIG. 4 is a cross-sectional view taken along line B1-B2 in a direction indicated by an arrow in FIG. 2.

FIG. 2 is a plan view of the EL panel substrate. FIG. 3 is a cross-sectional view taken along line A1-A2 in a direction indicated by an arrow in FIG. 2. FIG. 4 is a cross-sectional view taken along line B1-B2 in a direction indicated by an arrow in FIG. 2.

The top or upper surface of the EL panel substrate 11 is the surface thereof united to the CF panel substrate 12 (the downside of the EL panel substrate in FIG. 1).

The EL panel substrate 11 has a plurality of pixels 30 arranged in a matrix along the surface of an EL substrate body 110. Each one of the pixels 30 is made up of three light-emitting elements (in three colors (R, G, and B)) 31(R), 31(G), and 31(B). Reference sign 31 hereinafter denotes the light-emitting elements in generality, without regard for the color emitted thereby.

Each of the light-emitting elements 31 is elongated. The three light-emitting elements 31(R), 31(G), and 31(B) are aligned in the widthwise direction of the light-emitting elements 31 such that each of the pixels 30 forms an approximate square when viewed in the plane (see FIG. 2).

The following explanations primarily reference FIG. 2 to FIG. 4.

A TFT 111 and an inter-layer insulating film 112 are formed above the EL substrate body 110.

An anode 113a is disposed at the top surface of the inter-layer insulating film 112 for each of the light-emitting elements 31. Each anode 113a is shaped so as to be elongated, like the light-emitting elements 31 as seen in the plane view. As shown in FIG. 3 and FIG. 4, other than the anodes 113a, auxiliary electrodes 113b are formed at the top surface of the inter-layer insulating film 112 between the pixels 30.

A bank 114 is formed between any two neighboring anodes 113a and between any given anode 113a and neighboring auxiliary electrode 113b. Each bank 114 extends upward from an area on the inter-layer insulating film 112 where no anode 113a or auxiliary electrode 113b is formed so as to pass between the anodes 113a and the auxiliary electrodes 113b.

A light-emitting layer 115 emitting light of a predetermined color (here, an organic light-emitting layer) is layered over each anode 113a within a region defined by the banks 114 (i.e., surrounded by the banks 114).

The predetermined color is three colors, i.e., "blue", "green" and "red". Alternatively, another color different from these three colors, e.g., yellow or white, may be included. In FIG. 3, the blue light-emitting layer is represented by "115(B)", the green light-emitting layer is represented by "115(G)", and the red light-emitting layer is represented by "115(R)". Reference sign 115 hereinafter denotes the light-emitting layers in generality, without regard for the color emitted thereby.

A cathode 116 and a sealing layer 117 are respectively formed on the organic light-emitting layer 115 so as to traverse the areas defined by the banks 114 and extend over the neighboring organic light-emitting layers 115 and auxiliary electrodes 113b. The sealing layer 117 serves to prevent the exposure of the organic light-emitting layers 115 and so on to water and air.

Figure 10:
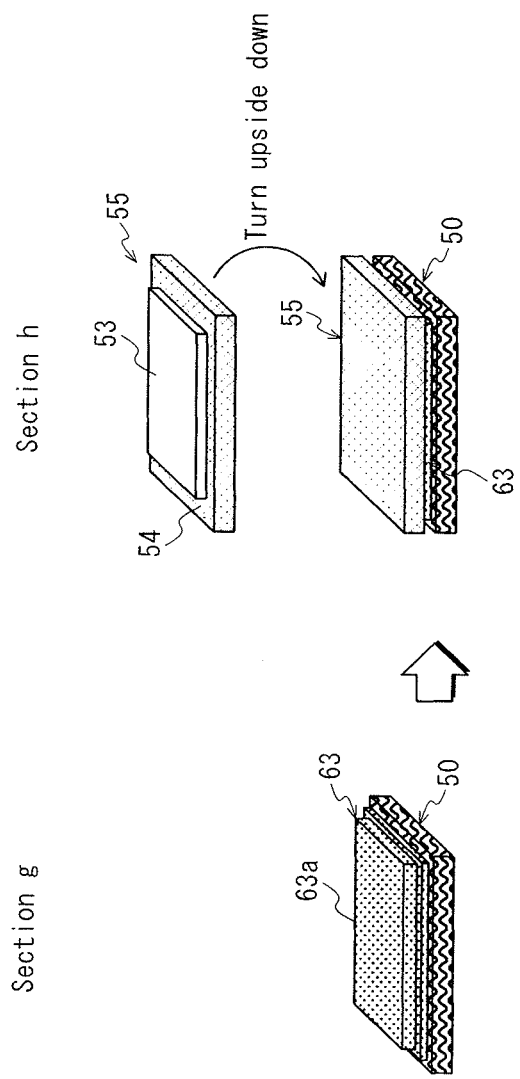
FIG. 10 illustrates the method of manufacturing the display panel of Embodiment 1.

Note that an EL element 53 is composed of the TFT 111, the inter-layer insulating film 112, the anode 113a, the auxiliary electrode 113b, the bank 114, the organic light-emitting layer 115, the cathode 116, and the sealing layer 117 (see section h in FIG. 10).

(3) CF Panel Substrate

Figure 5:
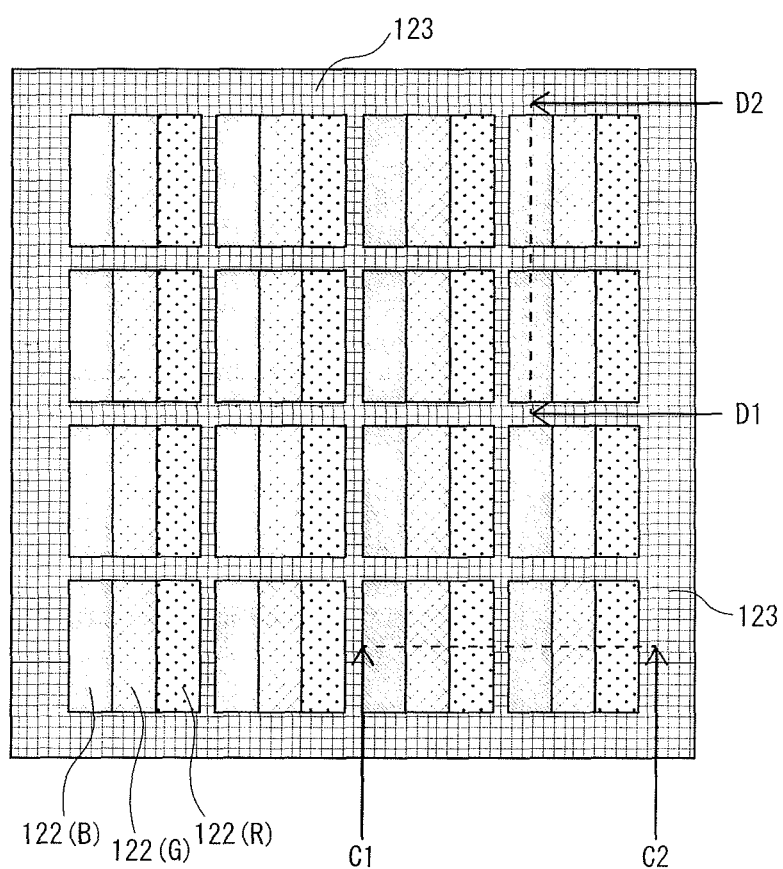
FIG. 5 is a plan view of a CF element.
Figure 6:
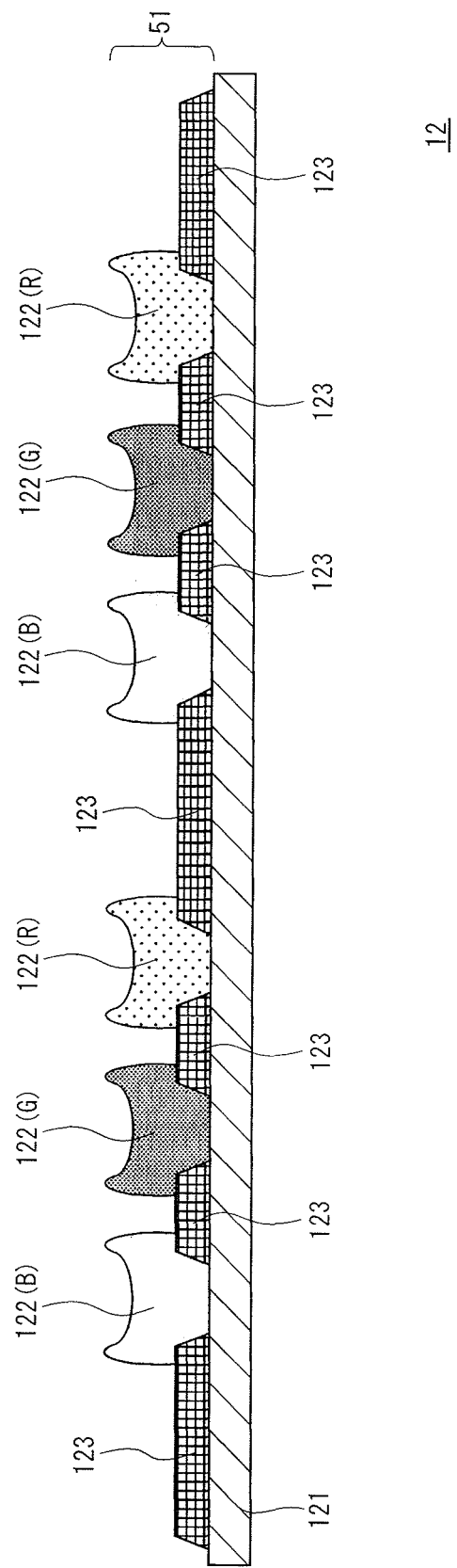
FIG. 6 is a cross-sectional view taken along line C1-C2 in a direction indicated by an arrow in FIG. 5.
Figure 7:
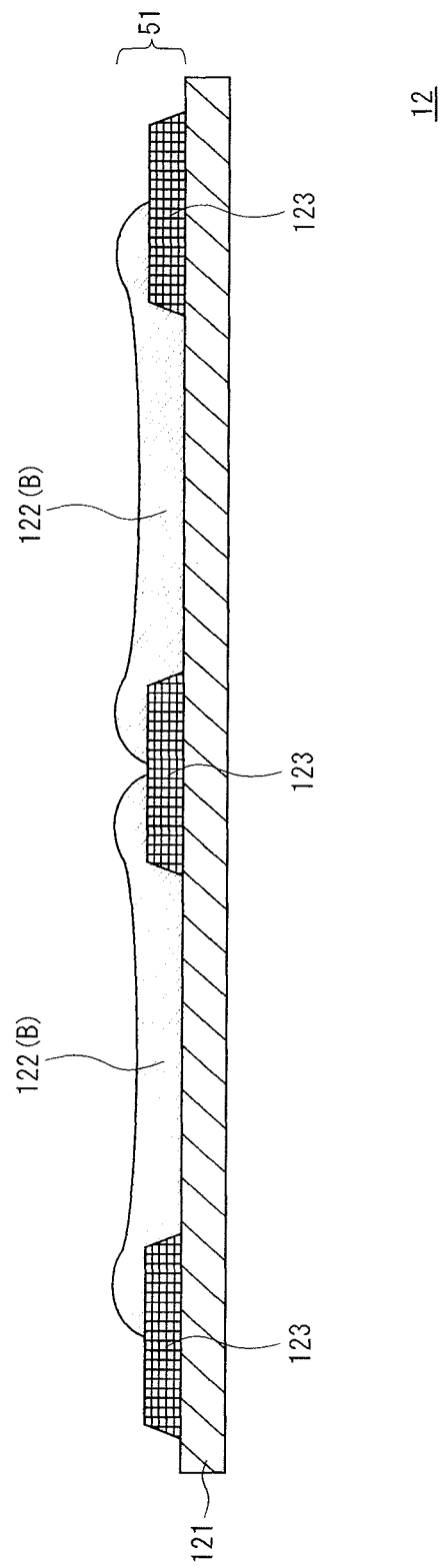
FIG. 7 is a cross-sectional view taken along line D1-D2 in a direction indicated by an arrow in FIG. 5.

FIG. 5 is a plan view of a CF panel substrate. FIG. 6 is a cross-sectional view taken along line C1-C2 in a direction indicated by an arrow in FIG. 5. FIG. 7 is a cross-sectional view taken along line D1-D2 in a direction indicated by an arrow in FIG. 5.

The top or upper surface of the CF panel substrate 12 is the surface thereof united to the EL panel substrate 11 (the upside of the CF panel substrate in FIG. 1).

The CF panel substrate 12 includes a CF substrate body 121 and a CF element. In other words, the CF panel substrate 12 is made up of the CF substrate body 121, color filters 122, and so on.

As shown in FIG. 5, each of the color filters 122 is elongated when viewed in the plane, similar to the light-emitting elements 31 illustrated in FIG. 2.

The following explanations primarily reference FIG. 4, FIG. 6, and FIG. 7.

The CF substrate body 121 is the frontal substrate of the display panel 10, and is made of a light-transmissive material. Color filters 122(B), 122(G), and 122(R) are formed on the top surface of the CF substrate body 121, respectively corresponding to the organic light-emitting layers 115(B), 115(G), and 115(R) of the EL panel substrate 11. Reference sign 122 hereinafter denotes the color filters in generality, without regard for color.

A black matrix (hereinafter abbreviated "BM") 123 is arranged at the top surface of the CF substrate body 121 between the color filters 122. As shown in FIG. 6 and FIG. 7, each of the color filters 122 is shaped so as to partly overlap the top circumferential edge of the neighboring BM 123 to each side.

The BM 123 is a black layer provided to improve display contrast by preventing external light from irradiating or shining on the display surface of the display panel 10. As shown in FIG. 1, the BMs 123 are formed to correspond to (i.e., to oppose) positions of the banks 114 of the EL panel substrate 11.

Figure 8:
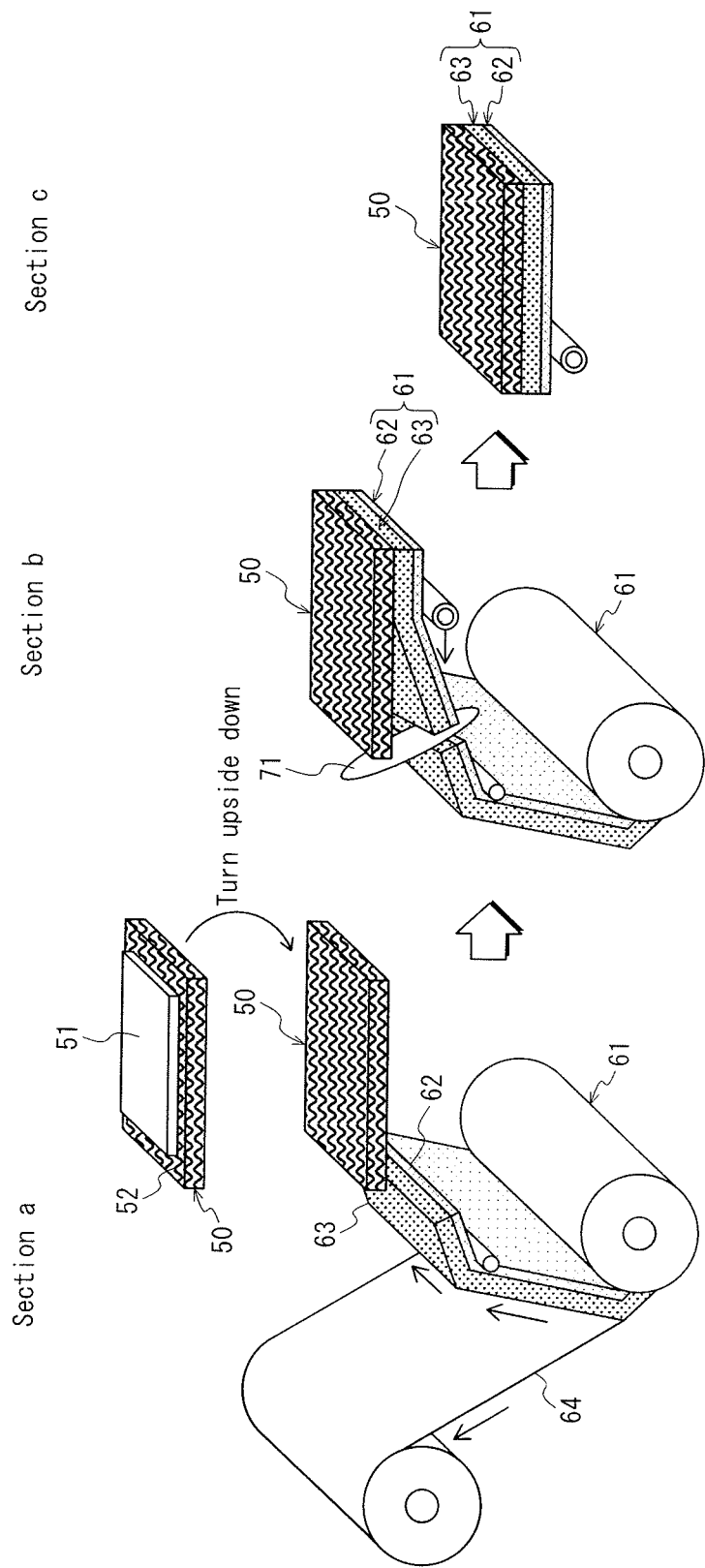
FIG. 8 illustrates a method of manufacturing the display panel of Embodiment 1.

Note that the color filters 122 and the BMs 123 constitute a CF element 51 (see section a in FIG. 8).

2. MANUFACTURING METHOD

The display panel 10 is manufactured through steps including a step of preparing an EL substrate 55 including an EL element 53 formed on an EL base material 54, a step of preparing a CF substrate 50 including a CF element 51 formed on a CF base material 52, and a step of uniting the prepared EL substrate 55 and CF substrate 50.

The display panel 10 results from uniting the EL substrate 55 and the CF substrate 50 and cutting the united EL substrate 55 and CF substrate 50. The EL base material 54 and the CF base material 52 after cut correspond to the EL substrate body 110 and the CF substrate body 121 of the display panel 10, respectively.

The steps of preparing the EL substrate 55 and the CF substrate 50 are the same as conventional steps, and the descriptions thereof are omitted.

In the following description, a sealing resin material 63 used for the sealing resin layer 13 is attached to the CF substrate 50 when the EL substrate 55 and the CF substrate 50 are united (that is, the case where the first substrate and the first functional unit of the present invention are the CF substrate and the CF element, respectively). Alternatively, the resin material may be attached to the EL substrate (that is, the case where the first substrate and the first functional unit of the present invention are the EL substrate and the EL element, respectively).

The step of uniting the EL substrate 55 to the CF substrate 50 includes the following steps: an attaching step of attaching the sealing resin material 63 of the sheet material 61 to the CF substrate 50 (step (C) described below, sections b and c in FIG. 8); a slit forming step of forming a slit 65 on the sheet material 61 attached to the CF substrate 50, along an outline of an attachment area (an area in which the sealing resin material 63 remains when the EL substrate 55 and the CF substrate 50 are joined to each other, and is equivalent to the predetermined area of the present invention) (step (D) described below, section d in FIG. 9); and a separating step of separating interior portions of the sealing resin material 63 from the separator 62 as the sheet base material, taking the outer periphery of the slit 65 to be borders, to keep the interior portions of the sealing resin material 63 on the attachment area of the CF substrate 50 and not to keep an exterior portion of the sealing resin material 63 on the CF substrate 50 (steps (E) and (F) described below, sections e and f in FIG. 9). The following uses the CF substrate 50 and the EL substrate 55 in which one EL element 53 and one CF element 51 are respectively formed.

Figure 9:
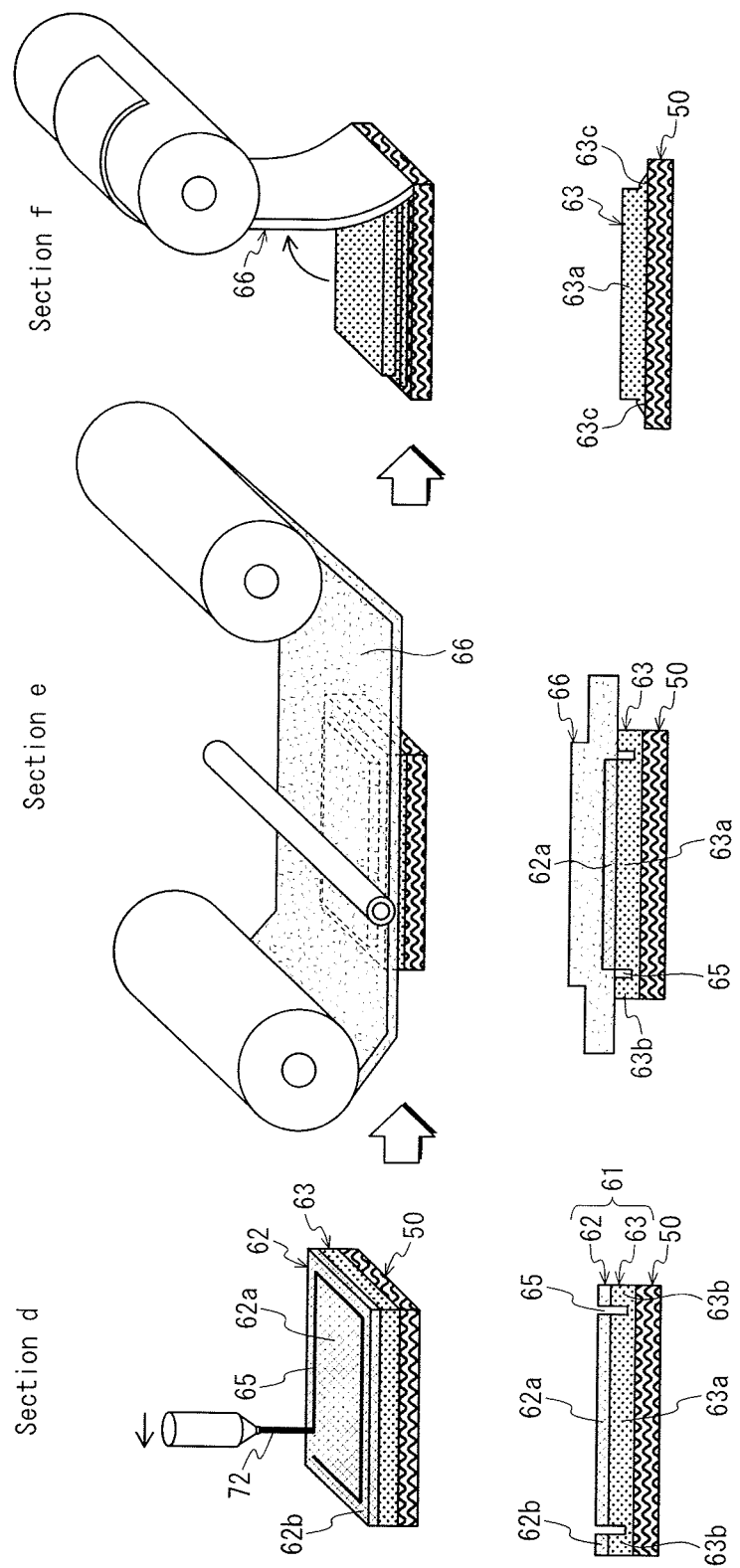
FIG. 9 illustrates the method of manufacturing the display panel of Embodiment 1.

FIG. 8 to FIG. 10 illustrate a method of manufacturing the display panel of Embodiment 1.

FIG. 8 to FIG. 10 schematically show distinctive states in a plurality of steps in sections a to h. Each figure has a perspective view (hatching may be provided even at portions that are not cross-sections in order to distinguish one member from another, to improve visibility). Also, in order to show characteristics in cross-section, FIG. 9 includes respective cross-sectional views under the perspective views.

As shown in the section a in FIG. 8, the sheet material 61 has a laminate structure in which the sealing resin material 63 is sandwiched between the two separators 62 and 64. Note that the sheet material 61 refers to a material composed of the two separators 62 and 64 and the sealing resin material 63, but even after one of the separators (e.g., separator 64) is peeled off during the manufacturing process, the remaining material is also referred to as the sheet material 61.

The slit 65 is formed by using a utility blade or a laser beam, or formed by punching, for example. Here, a laser beam is used.

With reference to FIG. 8 to FIG. 10, the method of manufacturing the display panel 10 specifically includes the following steps.

(A) Preparing the CF substrate 50 in which one CF element 51 is formed (the number of CF elements 51 may be plural as described below) (a step of preparing CF substrate (first substrate)), and cleansing an attachment surface of the sealing resin material 63 (by UV ozone cleaning, for example). Note that the step of preparing CF substrate may include or not include a step of cleansing CF substrate.

(B) Preparing the sheet material 61, and peeling off a separator which is on the side of the sheet material 61 that is to be attached to the CF substrate 50 (here, a lower separator 64). As shown in section a in FIG. 8, the sheet material 61 here is supplied in the form of a roll, and while the sheet material 61 is drawn out, one of the separators 64 of the sheet material 61 is peeled off and is rolled by the other shaft.

(C) Drawing out the sheet material 61 from which the separator 64 is peeled off as shown in section a in FIG. 8, while the sealing resin material 63 faces the CF substrate 50, here while the sealing resin material 63 is positioned upper than the other separator 62.

Then, the surface of the CF substrate 50 in which the CF element 51 is formed is faced downward, the CF substrate 50 is attached to the sealing resin material 63 which is on the upper surface of the sheet material 61, and the sheet material 61 is cut in accordance with the length of the CF substrate 50 (sections b and c in FIG. 8).

Here, the width of the sheet material 61 (the length in a direction perpendicular to the drawing direction) corresponds to the width of the CF substrate 50. The sheet material 61 may be cut using a utility blade 71, and alternatively a laser beam or the like.

Note that the sheet material 61 may be cut in accordance with the length of the CF substrate 50 after being attached to the CF substrate 50.

In this case, the sheet material 61 only needs to be attached to at least the attachment area on the CF substrate 50, and it is unnecessary to precisely position the sealing resin material 63 compared to the case of attaching the sealing resin material 63 that is cut along the outline of the attachment area and attaching the cut sealing resin material 63 to the attachment area. Note that, as shown in the figure, since the sealing resin material 63, which is on the upper surface of the sheet material 61, is supplied in the form of a roll, the process load is reduced.

(D) Turning upside down the CF substrate 50, which is attached to the upper surface of the sheet material 61, together with the sheet material 61, such that the sheet material 61 is positioned on the CF substrate 50. Then, a slit 65 is formed in the sheet material 61 which is attached to the CF substrate 50 in accordance with the size and shape of the attachment area of the sealing resin material 63 that is to be attached to the upper surface of the CF element 51 (the outer edge of the sealing resin material 63) (section d in FIG. 9).

In this way, since the slit 65 is formed after the sheet material 61 is attached to the CF substrate 50 (after the CF substrate 50 is attached to the sheet material 61), it is unnecessary to take into consideration deformation of the sheet material 61 that occurs when the sheet material 61 is attached to the CF substrate 50. Accordingly, the slit 65 is formed in the sheet material 61 at a high degree of accuracy.

Note that the reference sign of each member having the letter "a" added thereto indicates the inside of the attachment area surrounded by the slit 65, and the reference sign of each member having the letter "b" added thereto indicates the outside of the attachment area surrounded by the slit 65.

The slit 65 is formed along each side of a rectangle in accordance with the size of the CF element 51. In other words, the attachment area is rectangular. The slit 65 is formed by making a continuous groove along the main surface of the sheet material 61 to the extent that part of the sealing resin material 63 remains in the thickness direction of the sheet material 61.

The slit 65 is formed so as to have a depth that allows that when the separator 62 is peeled off from the sealing resin material 63 after the slit 65 is formed, only a sealing resin material part 63a inside the attachment area surrounded by the slit 65 remains on the upper surface of the CF element 51, and a sealing resin material part 63b outside the attachment area on the upper surface of the CF element 51 is peeled off together with the separator 62.

To be specific, the slit 65 has the depth that allows that when the sealing resin material part 63b outside the attachment area is peeled from the CF substrate 50, the sealing resin material 63 is cut around a bottom part of the slit 65 with no influence on the sealing resin material part 63a inside the attachment area that is continuous with the sealing resin material part 63b in the bottom part of the slit 65.

Also, the slit 65 is formed such that the sealing resin material 63 remains below the slit 65. This prevents the CF substrate 50 (the CF base material 52) from having scratches during formation of the slit 65. In the case where a laser beam is used for forming the slit 65, the laser beam does not reach the CF base material 52, and accordingly, the CF base material 52 cannot have scratches.

After the slit 65 is formed, an outside part 62b of the separator 62 that is outside the slit 65 is peeled off. Peeling off of the outside part 62b of the separator 62 outside the slit 65 is performed for example by attaching an adhesive tape to the outside part 62b. After the outside part 62b is peeled off, a peeling tape 66 for peeling off unnecessary resin parts shown in section e in FIG. 9 will be attached.

(E) Attaching the peeling tape 66 to the sheet material 61 in which an inside part 62a of the separator 62 remains in the attachment area surrounded by the slit 65 (section e in FIG. 9). The sheet material 61 is closely attached to the peeling tape 66, at the inside part 62a inside the attachment area surrounded by the slit 65 and at the sealing resin material part 63b outside the attachment area surrounded by the slit 65.

(F) Peeling off the peeling tape 66 which is attached to the sheet material 61 from the sealing resin material 63 (section f in FIG. 9). An adhesive force between the peeling tape 66 and the separator 62 is greater than an adhesive force between the separator 62 and the sealing resin material 63. Also, an adhesive force between the peeling tape 66 and the sealing resin material 63 is greater than an adhesive force between the sealing resin material 63 and the CF substrate 50. Furthermore, an adhesive force between the peeling tape 66 and the sealing resin material 63 is greater than an adhesive force between the peeling tape 66 and the CF substrate 50 (the CF base material 52).

After the peeling tape 66 is peeled off, the sealing resin material part 63a inside the attachment area surrounded by the slit 65 and a sealing resin material part 63c that is continuous with the bottom part of the slit 65 remain on the CF substrate 50, and the sealing resin material part 63*b* outside the attachment area is peeled off together with the peeling tape 66 without remaining on the CF substrate 50.

At this point, the resin material part 63 inside the attachment area is fixed by the slit 65 formed at an area corresponding to the outer edge (border) of the attachment area, and is closely attached to the CF substrate 50. Accordingly, the resin material part 63*a* is unlikely to be deformed when the separator 62 (to be exact, the peeling tape 66 to which the separator 62 is attached) is peeled off.

Also, in the case where a laser beam is used for forming the slit 65, a part of the sealing resin material 63 facing the slit 65 (part of the sealing resin material 63 including a surface of the slit 65) is cured (in other words, this cured part of the sealing resin material 63 is higher in reaction rate than the sealing resin material 63 before irradiation with the laser beam). As a result, the part of the sealing resin material 63 is unlikely to extend. This prevents the sealing resin material part 63*a* inside the attachment area from extending to be thin when the sealing resin material part 63*b* outside the attachment area is peeled off.

The reaction rate of resin here indicates a degree of cross-linking of resin that is cured by cross-linking reaction, and also indicates a degree of polymerization of resin that is cured by polymerization reaction. Note that, even in the case where the display panel 10 is formed by joining the CF substrate 50 and the EL substrate 55, the difference in reaction rate is measured as difference in reaction rate of the resin layer by FT-IR (Fourier Transform Infrared Spectroscopy) or the like.

Also, the sealing resin material 63 is cut off from the part where the slit 65 is formed, and the sealing resin material part 63*a* remaining on the CF substrate 50 corresponds to the attachment area in size. As a result, the sealing resin material part 63*a* is accurately attached to the CF substrate 50 (section g in FIG. 10).

(G) Preparing the EL substrate 55 in which one EL element 53 is formed, and uniting the EL substrate 55 and the CF substrate 50 while the CF element 51 and the EL element 53 face each other (section h in FIG. 10).

The EL substrate 55 may be cleaned after preparation, or may be prepared after cleaning. In this way, the preparing step of the EL substrate 55 may include or may not include a cleansing step.

(H) Curing the sealing resin material part 63*a* by heating (or applying UV to) the united CF substrate 50 and EL substrate 55 under a vacuum atmosphere for example.

(I) Dividing the joined CF substrate 50 and EL substrate 55 into individual substrates by cutting the periphery of the joined CF substrate 50 and EL substrate 55, after curing the sealing resin material parts 63*a*. The display panel 10 is thus obtained.

In the above manufacturing method, in particular, in the step of uniting the EL substrate 55 and the CF substrate 50, the slit 65 is formed after the sealing resin material 63 as the sheet material 61 is attached to the CF substrate 50. Therefore, even if the sealing resin material 63 is deformed when the sheet material 61 is attached, the slit 65 is formed in the deformed sealing resin material 63, and as a result, it is possible to accurately cut the sealing resin material 63, and to accurately attach the cut sealing resin material 63 to the CF substrate 50.

Furthermore, since the slit 65 is formed such that the part of the sealing resin material 63 that is close to the CF substrate 50 remains, the CF substrate 50 (the CF base material 52) cannot have scratches. If the CF substrate 50 has scratches, a trouble might occur such as occurrence of cracks originating from the scratches.

Embodiment 2

In Embodiment 1, the description has been given on the manufacturing method of the display panel 10 by using the CF substrate 50 (the first substrate) in which one CF element 51 is formed and the EL substrate 55 (the second substrate) in which one EL element 53 is formed.

Alternatively, the number of CF elements (first functional units) and the number of EL elements (second functional units) respectively formed on the CF base material and the EL base material are each not limited to one. Alternatively, a plurality of CF elements and a plurality of EL elements may respectively be formed in the CF substrate and the EL substrate. The following describes the case where a display panel is manufactured by using a CF substrate in which a plurality CF elements are formed and an EL substrate in which a plurality of EL elements are formed. Also in the present embodiment, a slit is formed by using a laser beam.

1. Manufacturing Method

A display panel 10 is manufactured through steps including a step of preparing a CF substrate 150 including a plurality of CF elements 51 formed on a CF base material 152, a step of preparing an EL substrate 155 including a plurality of EL elements 53 formed on an EL base material 154, a step of uniting the prepared EL substrate 155 and CF substrate 150, and a step of dividing the united EL substrate 155 and CF substrate 150 into individual substrates.

Figure 11:
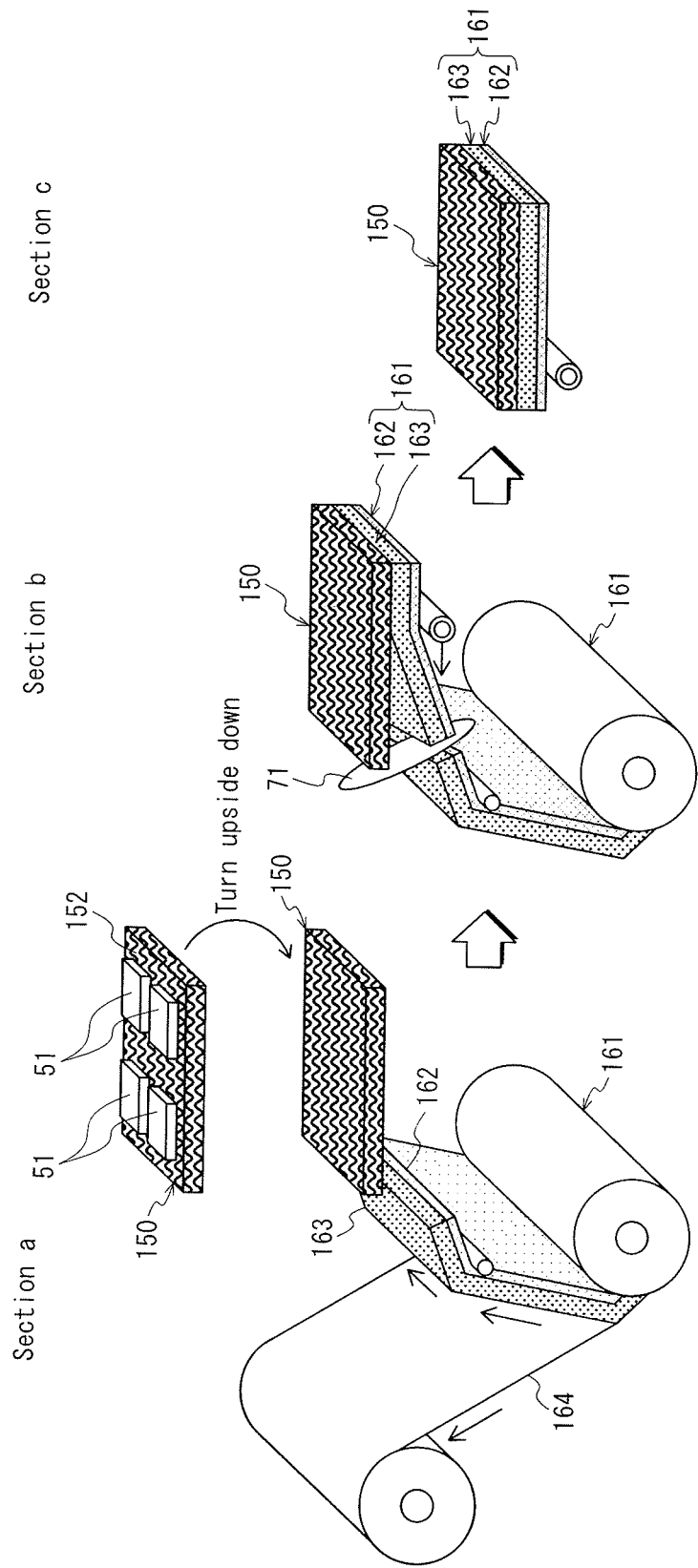
FIG. 11 illustrates a method of manufacturing a display panel of Embodiment 2.
Figure 12:
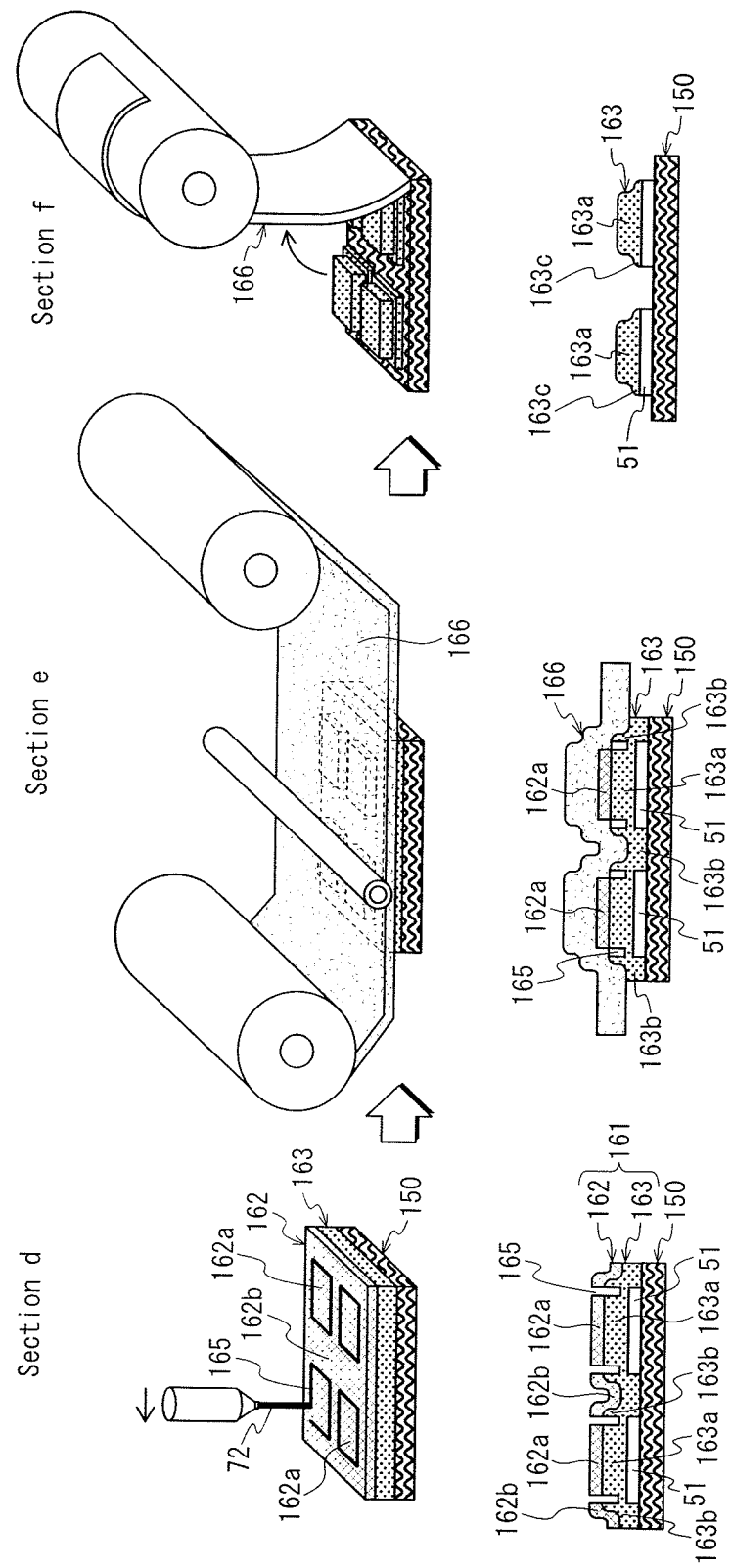
FIG. 12 illustrates the method of manufacturing the display panel of Embodiment 2.

The step of uniting the CF substrate 150 and the EL substrate 155 includes: an attaching step of attaching a sealing resin material 163 of a sheet material 161 to the CF substrate 150 (the first substrate) (step (2C) described blow, sections b and c in FIG. 11); a slit forming step of forming a slit 165 by cutting the sheet material 161 along an outline of each attachment area of the CF substrate 150 (step (2D) described blow, section d in FIG. 12); and a separating step of separating the sealing resin material 163 on attachment areas from the sheet material 161 to keep only parts of the sealing resin material 163 on the attachment areas of the CF substrate 150 (steps (2E) and (2F) described blow, sections e and f in FIG. 12).

FIG. 11 to FIG. 13 illustrate a method of manufacturing the display panel of Embodiment 2.

FIG. 11 to FIG. 13 schematically show distinctive states in a plurality of steps in sections a to i. Each figure has a perspective view (hatching may be provided even at portions that are not cross-sections in order to distinguish one member from another, to improve visibility). Also, in order to show characteristics in cross-section, FIG. 12 includes respective cross-sectional views under the perspective views.

With reference to FIG. 11 to FIG. 13, the method of manufacturing the display panel 10 specifically includes the following steps.

(2A) Preparing the CF substrate 150 in which a plurality of CF elements 51 are formed (section a in element FIG. 11). Note that the step of preparing CF substrate may include or may not include a step of cleansing CF substrate 150 (by UV ozone cleaning, for example).

In the present embodiment, since the CF substrate 150 is attached to the sealing resin material 163 which is on the upper surface of the sheet material 161, the CF substrate 150 is turned upside down such that the CF elements 51 are positioned lower.

(2B) Preparing the sheet material 161, and peeling off, from the sheet material 161, a separator which is on the side of the sheet material 161 that is to be attached to the CF substrate 150 (here, a lower separator 164) (section a in FIG. 11). Also in the present embodiment as shown in section a in FIG. 11, the sheet material 161 here is supplied in the form of a roll, and while the sheet material 161 is drawn out, one of the separators 164 of the sheet material 161 is peeled off and is rolled by the other shaft.

(2C) Drawing out the sheet material 161 from which the separator 164 is peeled off as shown in section a in FIG. 11, while the sealing resin material 163 faces the CF substrate 150 (the sealing resin material 163 is positioned upper than the other separator 162).

Then, the surface of the CF substrate 150 in which the CF elements 51 are formed is faced downward, and the CF substrate 150 is attached to the sealing resin material 163 which is on the upper surface of the sheet material 161, and the sheet material 161 is cut in accordance with the length of the CF substrate 150 (sections a to c in FIG. 11).

Here, the width of the sheet material 161 (the length in a direction perpendicular to the drawing direction) corresponds to the width of the CF substrate 150. Also, the sheet material 161 may be cut using a utility blade 71, and alternatively a laser beam or the like.

Note that the sheet material 161 may be cut in accordance with the length of the CF substrate 150 after being attached to the CF substrate 150.

(2D) Turning upside down the CF substrate 150, which is attached to the upper surface of the sheet material 161, together with the sheet material 161, such that the sheet material 161 is positioned on the CF substrate 150, and forming slits 165 by cutting the sheet material 161, which is attached to the CF substrate 150, in accordance with the size and shape of each attachment area (each CF element 51) (section d in FIG. 12).

In this way, the slits 165 are formed at areas corresponding to the outer edges (borders) of the attachment areas after the sheet material 161 is attached. Accordingly, the slits 165 are accurately formed along the attachment areas.

Note that the reference sign of each member having the letter "a" added thereto indicates the inside of the attachment area surrounded by each of the slits 165, and the reference sign of each member having the letter "b" added thereto indicates the outside of the attachment area surrounded by the slit 165.

The slits 165 are each formed along each side of a rectangle in accordance with the size of the attachment area corresponding to each CF element 51, like in Embodiment 1. The slit 165 is formed by making a continuous groove along the main surface of the sheet material 161 (to be exact, only the sealing resin material 163) to the extent that part of the sealing resin material 163 remains in the thickness direction of the sheet material 161. For this reason, like in Embodiment 1, in the case where a laser beam is used for forming the slit 165, the laser beam does not reach the CF substrate 150 (the base material 152), and accordingly the CF base material 152 cannot have scratches.

The slits 165 are each formed like in Embodiment 1 so as to have a depth that allows that when the separator 162 is peeled off from the sealing resin material 163 after the slit 165 is formed, only a sealing resin material part 163a inside the attachment area surrounded by the slit 165 remains on the upper surface of the CF element 51, and a sealing resin material part 163b outside the attachment area on the upper surface of the CF substrate 150 is peeled off together with the separator 162. To be specific, part of the sealing resin material 163 where the slit 165 is formed only needs to be thinner than the sealing resin material part 163a inside the attachment area. For example, the part of the sealing resin material 163 where the slit 165 is formed may have a thickness of approximately 1 µm or greater.

After the slits 165 are formed, an outside part 162b of the separator 162 that is outside the attachment part is peeled off. Peeling off of the outside part 162b of the separator 162 outside the attachment area is performed for example by attaching an adhesive tape to the outside part 162b. After the outside part 162b is peeled off, a peeling tape 166 shown in section e in FIG. 12 will be attached.

(2E) Attaching the peeling tape 166 to the sheet material 161 in which an inside part 162a of the separator 162 remains in the attachment area surrounded by the slit 165 (section e in FIG. 12).

The sheet material 161 is closely attached to the peeling tape 166, at the four inside parts 162a of the separator 162 that are surrounded by the slits 165 and at the sealing resin material part 163b outside the four attachment areas that are surrounded by the slits 165.

(2F) Peeling off the peeling tape 166 which is attached to the sheet material 161 from the CF substrate 150 (section f in FIG. 12). After the peeling tape 166 is peeled off, the sealing resin material parts 163a attached to the attachment areas of the CF elements 51 and the sealing resin material parts 163c that are continuous with the bottom parts of the slits 165 remain on the CF substrate 150. Note that there is a case where part of the sealing resin material part 163b remains, which is continuous with the bottom parts of the slits 165.

Also, a relationship in adhesive force between a reverse surface of the separator 162 and the sealing resin material 163 and a relationship in adhesive force between the sealing resin material 163 and the CF substrate 150 are the same as those in Embodiment 1.

(2G) Preparing the EL substrate 155 in which four EL elements 53 are formed, and uniting the EL substrate 155 and the CF substrate 150 while that the CF elements 51 face the EL elements 53 in one-to-one correspondence (section g in FIG. 13). The EL substrate 155 may be cleaned after preparation, or may be prepared after cleaning. In this way, the preparing step of the EL substrate 155 may include or may not include a cleansing step.

(2H) Curing the sealing resin material parts 163a by heating the united CF substrate 150 and EL substrate 155 under a vacuum atmosphere for example (section h in FIG. 13).

(2I) Dividing the joined CF substrate 150 and EL substrate 155 into individual substrates by cutting along the joined EL elements 53 and CF elements 51, after curing the sealing resin material parts 163a (section i in FIG. 13). The display panel 10 is thus obtained.

In the above manufacturing method, in particular, in the step of uniting the CF substrate 150 and the EL substrate 155, the slits 165 are formed after the sealing resin material 163 as the sheet material 161 is attached to the CF substrate 150 (the first substrate). Even if the sealing resin material 163 is deformed when the sheet material 161 is attached, the slits 165 are formed in the deformed sealing resin material 163, and as a result, it is possible to accurately cut the sealing resin material 163, and to accurately attach the cut sealing resin material 163 to the CF substrate 150.

<Modifications>

1. Manufacturing Method (1) The display panel 10 pertaining to Embodiment 1, etc., is manufactured through the steps including the step of preparing the second substrate (the EL substrate 55), the step of preparing the first substrate (the CF substrate 50), and the step of uniting the prepared first substrate and second substrate.

Alternatively, after part of the resin material of the sheet material 61 (the sealing resin material 63) is attached to the first substrate, the second substrate may be prepared, and subsequently the first substrate and the second substrate may be united to each other.

That is, the display panel may be manufactured as follows: the resin material of the sheet material is attached to the predetermined area of the first substrate, and subsequently the first substrate and the second substrate are united to each other. It suffices if the second substrate has been prepared when the second substrate is united to the first substrate.

In this way, the display panel only needs to be manufactured through the steps including: the step of preparing the first substrate; the step of attaching the resin material to the first substrate; the step of leaving part of the attached resin material in the attachment area while peeling off part of the attached resin material in an area other than the attachment area; the step of preparing the second substrate; and the step of uniting the first substrate and the second substrate. It is only necessary to prepare the second substrate until the second substrate is united.

To be specific, the second substrate may be prepared at the following point in time: before the sheet material is attached to the first substrate; after the sheet material (the sheet base material and the resin material) is attached to the first substrate (before the sheet base material is peeled off); after the first substrate and the second substrate are prepared to be united to each other (the resin material is attached only to the predetermined area (the attachment area) of the first substrate); when the first substrate is prepared; or before the first substrate is prepared.

(2) In the step (A) in Embodiment 1, etc., the EL substrate and the CF substrate are subject to UV ozone cleaning. Alternatively, other methods may be used to clean the substrates.

(3) In the step (C) in Embodiment 1, etc., the first substrate (the CF substrate 50) is positioned upper than the sheet material 61, and the sheet material 61 is attached to the lower surface of the first substrate (the CF substrate 50). Alternatively, the first substrate may be positioned lower than the sheet material 61, and the sheet material 61 may be attached to the upper surface of the first substrate. Further alternatively, the first substrate or the sheet material 61 may be turned upside down during the step.

That is, the vertical positional relationship between the sheet material 61 and the first substrate (the CF substrate 50) in Embodiment 1 may be reversed, and further, the sheet material 61 and the first substrate may be attached to each other from left and right.

(4) With respect to the cross-sectional shape of the slits 65 and 165 in the embodiments, it suffices if part of the resin material (the sealing resin material part 63*a* or 163*a*) remains in the predetermined area of the first substrate and part of the resin material outside the predetermined area (the resin material part 63*b* or 163*b*) is peeled off from the first substrate, when the sheet base material (the separator 62 or 162) is peeled off.

The slit may have a cross section having any of shapes as follows: a right-angled U-shape in which a bottom surface runs at right angles to a pair of side surfaces; a U-shape in which a bottom surface is semicircular; a V-shape in which linear side surfaces connect to each other; and a V-shape whose edge is cut.

The cross-sectional shape of the slit may be formed for example using a utility blade having a blade edge whose shape matches the shape of the slit. Alternatively, the cross-sectional shape of the slit may be formed using a laser beam with an adjusted energy distribution (light intensity distribution). For example, in the case where a laser beam with an energy distribution having a flat top (top hat) shape is used, the slit has a right-angled U-shape cross section. Also, in the case where a laser beam with an energy distribution that is close to the Gaussian distribution is used, the slit has a U-shape cross section. When the slit has a right-angled U-shape cross section, a shear force applied to the resin material concentrates on a part where the bottom surface runs at right angles to the side surfaces in the right-angled U shape. As a result, the resin material tears in the part where the share force concentrates, and accordingly the resin material part outside the predetermined area is easily peeled off from the first substrate. Also, it is preferable to use the laser beam with an energy distribution having a flat top (top hat) shape because the substrate is further difficult to be damaged.

(5) The slit may have any shape as long as, when viewed in plan, the resin material part inside the predetermined area surrounded by the slit remains on the first substrate and the resin material part outside the predetermined area does not remain on the first substrate.

FIG. 14A to FIG. 14D each show a modification of a slit when viewed in plan.

Figure 14A:
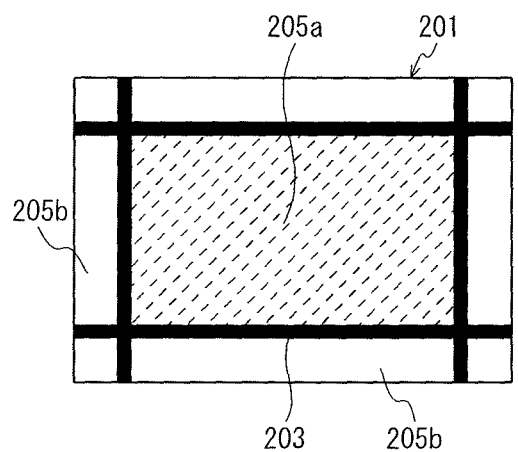
FIG. 14A to FIG. 14D each show a modification of a slit when viewed in plan.

According to Example 1 shown in FIG. 14A, a slit 203 is formed in a sheet material 201 by four linear grooves. A resin material part 205*a* inside a predetermined area surrounded by the slit 203 remains on the first substrate. A resin material part 205*b* outside the predetermined area does not remain on the first substrate. The four grooves are formed so as to completely traverse the sheet material 201 (but remain part of the resin material in the thickness direction).

Figure 14B:
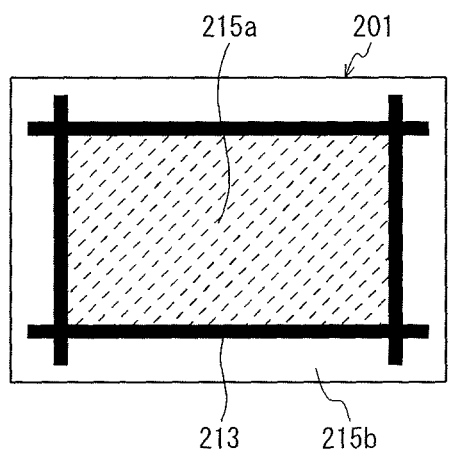

According to Example 2 shown in FIG. 14B, a slit 213 is formed in a sheet material 201 by four linear grooves. A resin material part 215*a* inside a predetermined area surrounded by the slit 213 remains on the first substrate. A resin material part 215*b* outside the predetermined area does not remain on the first substrate. Unlike in Example 1, the four grooves are formed so as not to completely traverse the sheet material 201. Each two adjacent grooves constituting an angle are formed so as to extend beyond an intersection point therebetween. Alternatively, each two adjacent grooves may be formed so as to intersect with each other but so as not to extend beyond the intersection point.

Figure 14C:
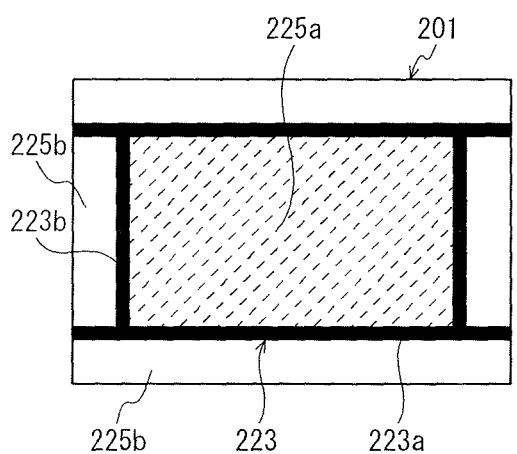

According to Example 3 shown in FIG. 14C, a slit 223 is formed in a sheet material 201 by four linear grooves. A resin material part 225*a* inside a predetermined area surrounded by the slit 223 remains on the first substrate. A resin material part 225*b* outside the predetermined area does not remain on the first substrate. The four grooves are formed by combining the grooves shown in Example 1 and 2. To be specific, one pair of grooves 223*a* facing each other are formed so as to completely traverse the sheet material 201, and the other pair of grooves 223*b* facing each other are formed so as not to extend beyond an intersection point between the grooves 223*a* and 223*b*. Alternatively, the long side and the short side shown in the figure may be reversed.

Figure 14D:
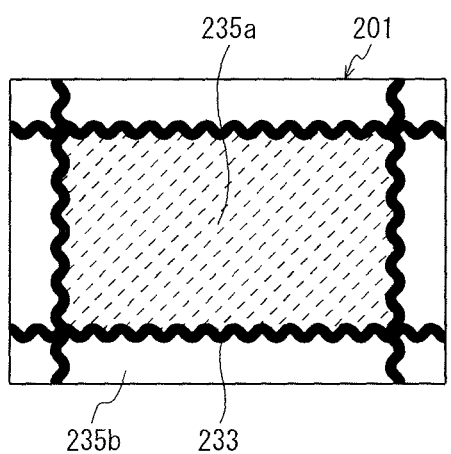

According to Example 4 shown in FIG. 14D, when a sheet material 201 is viewed in plan, a slit 233 has a similar shape to the slit 203 in Example 1 shown in FIG. 14A. Compared with the slit 203, four grooves constituting the slit 233 are formed so as to extend in slightly a zig-zag manner.

(6) The slit relating to the above embodiments for example is recessed relative to the sheet material in the thickness direction, and is continuous along the main surface of the sheet material. In other words, a groove which is recessed in the thickness direction extends in the direction perpendicular to the thickness direction. Alternatively, the slit may be formed so as to have alternate recess parts and no-recess parts to constitute a perforation shape. The recess parts are recessed relative to the sheet material, and the no-recess parts are not recessed relative to the sheet material. In this case, the length of each of the recess parts and the no-recess parts and/or the intervals between each two of the recess parts and the no-recess parts may be constant or may not be constant. Further, the slit may or may not consist of recess parts and no-recess parts that have the constant length and the constant intervals therebetween.

(7) In the step (H) in Embodiment 1 or in the step (2H) in Embodiment 2, the resin material (the sealing resin material 63) is cured by heat. Alternatively, depending on the type of resin material, the resin material may be cured by UV irradiation for example. Moreover, the resin material may be further cured by heat after UV irradiation. UV irradiation and heating may be used in this order or the reverse order, or UV irradiation and heating may be alternately repeated. It is natural that when the resin material is cured by other methods, these methods may be used to cure the resin material. These methods may be added to heating, or these methods and heating may be alternately used.

(8) In the above embodiments, any processing for facilitating peel-off of the resin material from the first substrate (the CF substrate 50) is not performed before the sheet material 61 is attached to the first substrate. Alternatively, release facilitating processing may be performed for forming a release film outside the predetermined area on the first substrate before the sheet material is attached to the first substrate. This facilitates peel-off of the resin material outside the predetermined area.

The release facilitating processing can be performed by for example forming a silicone resin film or a fluorine resin film, providing a silicone film or a fluorine film which has an opening corresponding to the predetermined area on the first substrate, or the like.

(9) In the above embodiments, any protection measures are not taken for a part under the slit during formation of the slit. However, protection measures may be taken by for example forming a resin layer for protection. Also, in the case where the first substrate is a CF substrate, protection measures may be taken by forming a BM at a portion of the first substrate corresponding to the part under the slit.

2. Number of First Functional Units and Method of Attaching Sheet Material (1) In the above embodiments, the method of attaching the first substrate and the sheet material is not particularly limited, and other attachment method may be used as follows.

In Embodiment 1, the one sheet material 61 is used for the first substrate (the CF substrate 50) in which the one first functional unit (the one CF element 51) is formed. In Embodiment 2, the one sheet material 161 is used for the first substrate (the CF substrate 150) in which the four first functional units (the four CF elements 51) are formed such that the sheet material 161 covers the first substrate.

Alternatively, the plurality of first functional units are arranged in two or more rows for the single first substrate, and one sheet material may be used for each row. In this case, the number of sheet materials to be used is equal to or less than the number of rows.

(2) Embodiment of Sheet Material

In the above embodiments, the sheet material has been described as being in the form of a roll. Alternatively, the sheet material may be preliminarily cut so as to be sheet-like and greater in size than the attachment area of the first substrate to which the resin material is to be attached, namely, the predetermined area.

(3) Size and Shape of Sheet Material

The sheet material needs to be greater in area than the area in which the slit is to be formed (the predetermined area). If this condition is satisfied, the sheet material may be greater in area than the first substrate, or may be smaller than the first substrate in area.

Here, the expression "greater in area" means that, for example, when the sheet material is put on the first substrate, etc., the predetermined area of the first functional unit is completely covered by the sheet material, and the expression "smaller in area" means that, for example, when the sheet material is put on the first substrate, the predetermined area of the first functional unit is not covered by the sheet material.

In the case where the sheet material is sheet-like, the shape of the sheet material is not particularly limited as long as the sheet material is greater in size than the predetermined area in which the slit is to be formed. Considering that the resin material part outside the predetermined area is to be discarded, the sheet material should be preferably have a shape in accordance with the area surrounded by the slit.

3. LASER BEAM

As a laser beam, various beams may be used such as a solid laser beam (e.g., a YAG laser beam, an Nd:YAG laser beam, and an Nd:YVO$_4$ laser beam), a gas laser beam (e.g., a CO$_2$ laser beam, an He—Ne laser beam, an excimer laser beam, an argon laser beam), and a liquid laser beam (e.g., Dye laser beam). Alternatively, the n-th order harmonics of these laser beams may be used (where, n is a positive integer).

Depending on the material of the first substrate, it may not be possible to use the above laser beam. That is, those laser beams at some wavelengths penetrate through the sheet material, and cannot cut the sheet material.

Therefore, it is preferable to use a laser beam at a wavelength that is (likely to be) absorbed by the sheet material. Such a laser beam has a power to cause material of each of the sheet base material and the resin material constituting the sheet material to disperse heat, evaporate or sublime over the entire thickness direction thereof.

Also, by selecting a wavelength of a laser beam at which low absorption is exhibited by the sheet base material (the separator 62 or 162) and high absorption is exhibited by the resin material (the sealing resin material 63 or 163), it is possible to form the slit in the predetermined area of the resin material because the laser beam penetrates through the sheet base material. Note that the concept of the resin material includes an adhesive and a sealing (encapsulation) material.

In the case where a PET film and an epoxy resin are respectively used as the sheet base material and the resin material of the sheet material, a laser beam at a wavelength equal to or shorter than 400 nm (e.g., a UV laser beam) or a CO$_2$ laser beam whose wavelength peak is 10.6 μm may be used. In the case where the sheet material including the separator 62 or 162 with a thickness of 50 μm and the sealing resin material with a thickness of 20 μm to 30 μm are irradiated with the CO$_2$ laser beam, an energy density for emission is preferably approximately 40 mJ/cm$^2$ to 65 mJ/cm$^2$.

4. SHEET MATERIAL

In the above embodiments, etc., the sheet material 61 is composed of the resin material (the sealing resin material 63) and the pair of sheet base materials 62 and 64 sandwiching the resin material. Examples of the sheet base materials include a PET film described above. However, it is possible to use film (resin) formed of other material, or to use paper material whose surface has been subject to peeling treatment.

Alternatively, it is possible to form the sheet material by providing (coating for example), with resin material, one of the main surfaces of a sheet base material that have peelability to resin material, and winding the sheet material into a roll.

When the sheet material with the above structure is used, the step (B) in Embodiment 1 (sections a and b in FIG. 8) and the step (2B) in Embodiment 2 (sections a and b in FIG. 11) in which the one (lower) separator 64 or 164 (the sheet base material) is peeled off from the sheet material are unnecessary.

5. DISPLAY PANEL

In Embodiment 1, etc., the display panel such as an organic EL display device has been described as an example of a joined body. However, the joined body may be an inorganic EL display device using an inorganic light-emitting layer. Alternatively, other display panels such as a liquid crystal display panel or a PDP may be used.

6. PREDETERMINED AREA

In Embodiments 1 and 2, the shape of each predetermined area to which the resin material is to be attached is rectangular. However, other shapes may be used. Other shapes include an ellipsoid (including circle), and a polygon such as a triangle and a pentagon.

Further, a quadrangular annular shape may be used. Examples of such an annular predetermined area include a circumferential area of the front panel when the joined body is a PDP device.

7. JOINED BODY

In Embodiments 1 and 2, the display panel is described as a joined body. Examples in which other joined bodies are formed include the followings: a PDP display device; the case where an antireflective film (so-called "AR film") is attached to a screen of a liquid crystal display device, an EL display device, a PDP display device, etc.; the case where a transparent substrate (e.g., ITO substrate, etc.) is attached to an information display screen (e.g., liquid crystal screen) (so-called touch screen); the case where an electromagnetic wave cutting film is attached to a PDP display device; the case where a sealing sheet (e.g., ethylene-vinyl acetate copolymers) is attached to a solar battery element in the field of solar batteries; the case where a smoke film is attached to a window; the case where a body film is attached to a vehicle in the field of vehicles, and so on.

8. CONCLUSION

In the present description, the manufacturing method of a joined body such as a display panel is described as a main invention. However, a main characteristic of the present description is a step in which a sheet-like resin material is attached only to the predetermined area of the first substrate (i.e., a peeling step in which only a resin material part inside the predetermined area is separated from the sheet material).

Therefore, the present description includes a method of attaching the resin material part only to the predetermined area of the first substrate.

The present description also includes a method of causing the resin material part inside the predetermined area to easily remain on the first substrate when the sheet base material of the sheet material is peeled off (e.g., formation of peeling film), or a method of cutting the sheet material.

INDUSTRIAL APPLICABILITY

The present invention is widely applicable to attaching the sheet-like resin material to the first substrate.

REFERENCE SIGNS LIST 10 display panel
11 EL panel substrate
12 CF panel substrate
13 sealing resin layer
50 first substrate
51 first element
52 first base material
53 second element
54 second base material
55 second substrate
61 sheet material
62, 64 separator (sheet base material)
63 sealing resin material
65 slit
66 peeling tape for peeling off unnecessary resin parts

The invention claimed is:

1. A method for manufacturing a joined body composed of a first substrate and a second substrate joined together by resin material attached to a predetermined area of the first substrate, the method comprising:
   attaching a sheet material to the first substrate so as to cover the predetermined area, the sheet material including a sheet base material and the resin material provided on one main surface of the sheet base material;
   forming, after the attaching, in the sheet material, a slit by reducing a thickness of the resin material along an outline of the predetermined area; and
   separating, after the forming, part of the resin material inside the slit from the sheet base material to keep the part of the resin material inside the slit on the predetermined area of the first substrate and not to keep the rest of the resin material outside the slit on the first substrate.

2. The method of claim 1, wherein
in the forming, the slit is formed by irradiating the resin material with a laser beam to remove the resin material to the extent that the thickness of the irradiated resin material partially remains.

3. The method of claim 2, wherein
owing to irradiation with the laser beam, at least part of the resin material that remains in a bottom part of the slit is higher in reaction rate than the resin material before irradiation with the laser beam.

4. The method of claim 3, wherein
owing to irradiation with the laser beam, part of the resin material constituting a sidewall of the slit is higher in reaction rate than the resin material before irradiation with the laser beam.

5. The method of claim 2, wherein
a wavelength of the laser beam is a wavelength at which the resin material and the sheet base material absorb the laser beam, and
a power of the laser beam is a power that causes the resin material to disperse heat, evaporate, or sublime.

6. The method of claim 2, wherein
the laser beam has a light intensity distribution with a top hat shape.

7. The method of claim 1, wherein
the sheet material has a layer structure of at least the sheet base material and the resin material.

8. The method of claim 1, wherein
the first substrate includes a first functional unit used for a display panel that is formed on a first base material, and
the slit is formed in an area of the first functional unit in which no image is to be displayed.

9. The method of claim 1, wherein
the joined body is a display panel,
the first substrate includes a first functional unit that is formed on a first base material,
the second substrate includes a second functional unit that is formed on a second base material,
the predetermined area of the first substrate is on a surface of the first substrate facing the second functional unit,
in the attaching, the sheet material is attached while the resin material faces the first functional unit, and
the method further comprises:
uniting, after the separating, the first substrate and the second substrate while the first functional unit and the second functional unit correspond to each other; and
curing, after the uniting, the resin material remaining on the predetermined area of the first substrate united with the second base material, wherein
the forming is performed before the uniting.

10. The method of claim 9, wherein
the first functional unit formed on the first base material is provided in a plurality, and
the second functional unit formed on the second base material is provided in a plurality.

11. The method of claim 9, wherein
the first functional unit is a color filter element, and
the second functional unit is an EL element.

12. The method of claim 9, further comprising
forming, before the attaching, a release film outside the predetermined area of the first substrate.

* * * * *